(12) United States Patent
Lee et al.

(10) Patent No.: US 12,406,735 B2
(45) Date of Patent: Sep. 2, 2025

(54) 3D MEMORY

(71) Applicant: MACRONIX International Co., Ltd., Hsinchu (TW)

(72) Inventors: Cheng-Yu Lee, Taoyuan (TW); Teng-Hao Yeh, Hsinchu County (TW); Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 180 days.

(21) Appl. No.: 18/504,157

(22) Filed: Nov. 8, 2023

(65) Prior Publication Data
US 2025/0149096 A1 May 8, 2025

(51) Int. Cl.
| | |
|---|---|
| *G11C 16/24* | (2006.01) |
| *G11C 5/06* | (2006.01) |
| *G11C 16/08* | (2006.01) |
| *H10B 43/10* | (2023.01) |
| *H10B 43/27* | (2023.01) |

(52) U.S. Cl.
CPC ............. *G11C 16/24* (2013.01); *G11C 5/063* (2013.01); *G11C 16/08* (2013.01); *H10B 43/10* (2023.02); *H10B 43/27* (2023.02)

(58) Field of Classification Search
CPC ......... G11C 16/24; G11C 5/063; G11C 16/08; H10B 43/10; H10B 43/27
USPC ...................................................... 365/185.01
See application file for complete search history.

(56) References Cited

U.S. PATENT DOCUMENTS

| | | | | |
|---|---|---|---|---|
| 2015/0003151 A1* | 1/2015 | Lee | ...................... | G11C 11/5628 365/185.02 |
| 2018/0308859 A1* | 10/2018 | Choi | ...................... | H10D 30/63 |
| 2020/0411539 A1* | 12/2020 | She | ...................... | H10B 43/27 |
| 2022/0020761 A1 | 1/2022 | Yeh et al. | | |
| 2022/0045099 A1 | 2/2022 | She et al. | | |

(Continued)

FOREIGN PATENT DOCUMENTS

| | | |
|---|---|---|
| TW | 202137227 | 10/2021 |
| TW | 202211384 | 3/2022 |
| TW | 202232668 | 8/2022 |

(Continued)

OTHER PUBLICATIONS

"Office Action of Taiwan Counterpart Application", issued on Jul. 4, 2024, pp. 1-4.

*Primary Examiner* — Alexander Sofocleous
*Assistant Examiner* — Duy H Luong
(74) *Attorney, Agent, or Firm* — J.C. PATENTS

(57) ABSTRACT

A 3D memory including a plurality of tiles, a bit line transistor structure, a first upper conductive layer, and a second upper conductive layer. The bit line transistor structure is disposed between a first sub-tile and a second sub-tile in the plurality of tiles. The first upper conductive layer includes a plurality of local bit lines, a plurality of local source lines and a conductive pattern. The plurality of local bit lines include a first group and a second group of local bit lines separated from each other, wherein two adjacent local bit lines are disposed between adjacent two local source lines. The second upper conductive layer includes a global bit line. The global bit line is electrically connected to the local bit lines through the conductive pattern. The 3D memory could be a 3D AND flash memory with high capacity and high performance.

20 Claims, 6 Drawing Sheets

(56) References Cited

U.S. PATENT DOCUMENTS

2022/0093600 A1 3/2022 Onuki et al.
2023/0095330 A1 3/2023 Lee et al.

FOREIGN PATENT DOCUMENTS

| TW | 202242880 | 11/2022 |
| TW | 202303619 | 1/2023 |
| TW | 202316423 | 4/2023 |

\* cited by examiner

3D MEMORY

BACKGROUND

Technical Field

The disclosure relates to a three-dimensional (3D) memory.

Description of Related Art

Non-volatile memory has the advantage that stored data will not disappear even after experiencing a power outage, so it is widely used in personal computers and other electronic devices. Currently, 3D memory commonly used in the industry includes NOR memory and NAND memory. In addition, another type of 3D memory is the AND memory, which can be applied in multi-dimensional memory arrays and has high integration and high area utilization, and has the advantage of fast operation speed. Therefore, the development of 3D memory has gradually become the current trend.

SUMMARY

The disclosure provides a 3D memory with relatively low bit line capacitance (CBL) and/or low background leakage current.

The 3D memory provided by the disclosure includes a plurality of tiles, a bit line transistor structure, a first upper conductive layer, and a second upper conductive layer. The plurality of tiles is disposed on a substrate, wherein one of the plurality of tiles includes a first sub-tile located in a first region of the substrate and a second sub-tile located in a second region of the substrate. The bit line transistor structure is disposed on the substrate and is located between the first sub-tile and the second sub-tile, and includes a first bit line transistor structure located in the first region and a second bit line transistor structure located in the second region. The first upper conductive layer is disposed on the substrate, and includes a plurality of local bit line, a plurality of local source lines, and a conductive pattern. The plurality of local bit line extends along a first direction and includes a first group of local bit lines and a second group of local bit lines, wherein the first group of local bit lines and the second group of local bit lines are separated from each other in the first direction. The plurality of local source lines extends along the first direction, wherein two adjacent local bit lines among the plurality of local bit lines are disposed between adjacent two local source lines. The conductive pattern is disposed between the first group of local bit lines and the second group of local bit lines in the first direction, and is disposed between the adjacent two local source lines in the second direction. The second upper conductive layer is disposed on the first upper conductive layer, and includes a global bit line, wherein the global bit line is electrically connected to the first group of local bit lines and the second group of local bit lines through the conductive pattern.

Based on the above, design of the 3D memory of the present disclosure could be realized by forming the conductive patterns in the first upper conductive layer. In detail, the 3D memory according to an embodiment of the present disclosure includes the tiles divided into the first sub-tile disposed in the first region and the second sub-tile disposed in the second region, and the plurality of the local bit lines are divided into the first group of local bit lines and the second group of local bit lines, wherein the global bit line could be electrically connected to the first group of local bit lines and the second group of local bit lines through the conductive patterns. In summary, the number of sectors driven by each bit line transistor structure could be reduced and the local bit lines could have a relative short length, which could reduce the bit line capacitance and the background leakage current, thereby improving the operating speed of the 3D memory according to an embodiment of the present disclosure.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The following examples are listed and described in detail with accompanying drawings, but the provided examples are not intended to limit the scope of the disclosure. In addition, the drawings are for illustrative purposes only and are not drawn to original size. To facilitate understanding, the same elements will be identified with the same symbols in the following description.

Figure 1A:
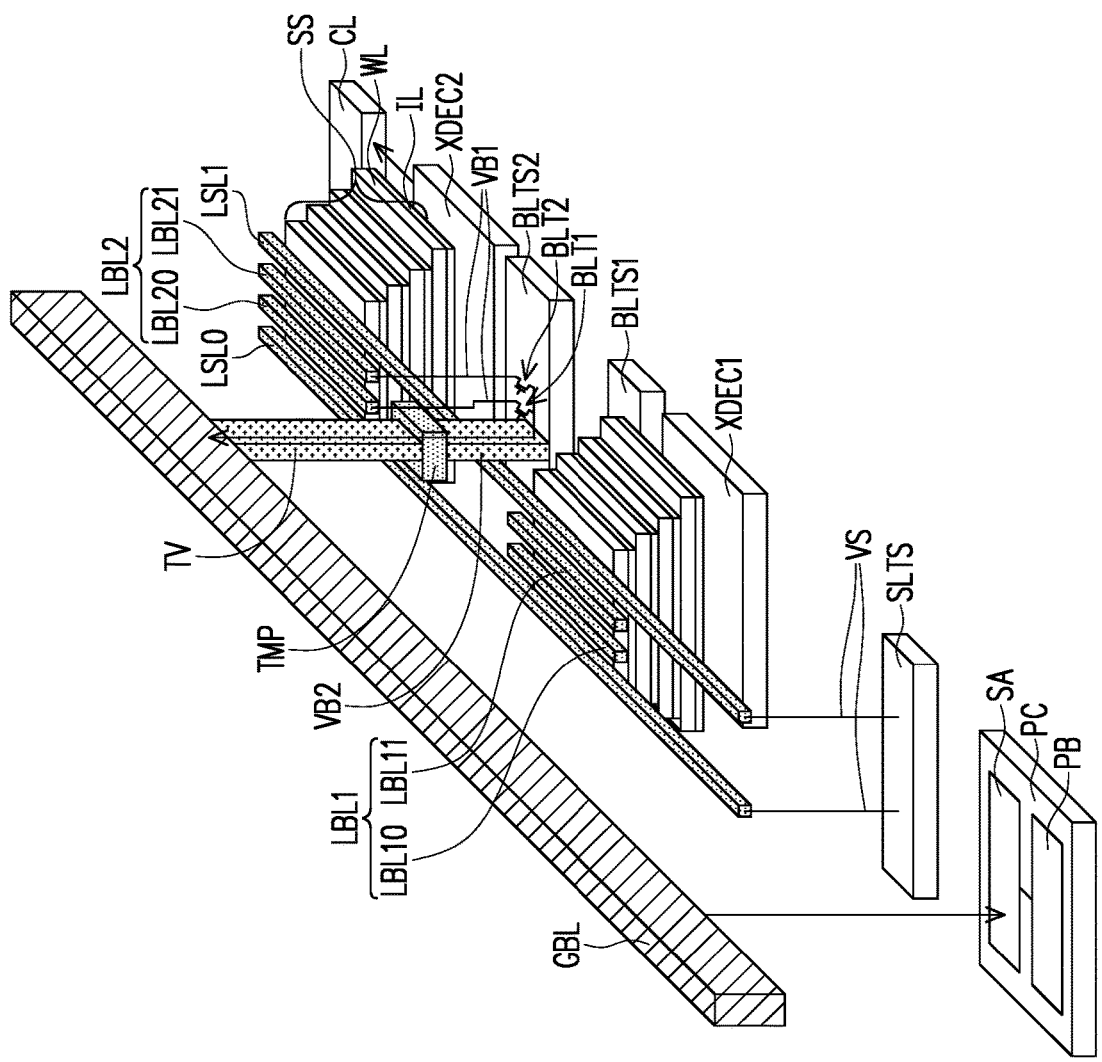
FIG. 1A is a partial perspective view of a 3D memory according to an embodiment of the present disclosure.
Figure 1B:
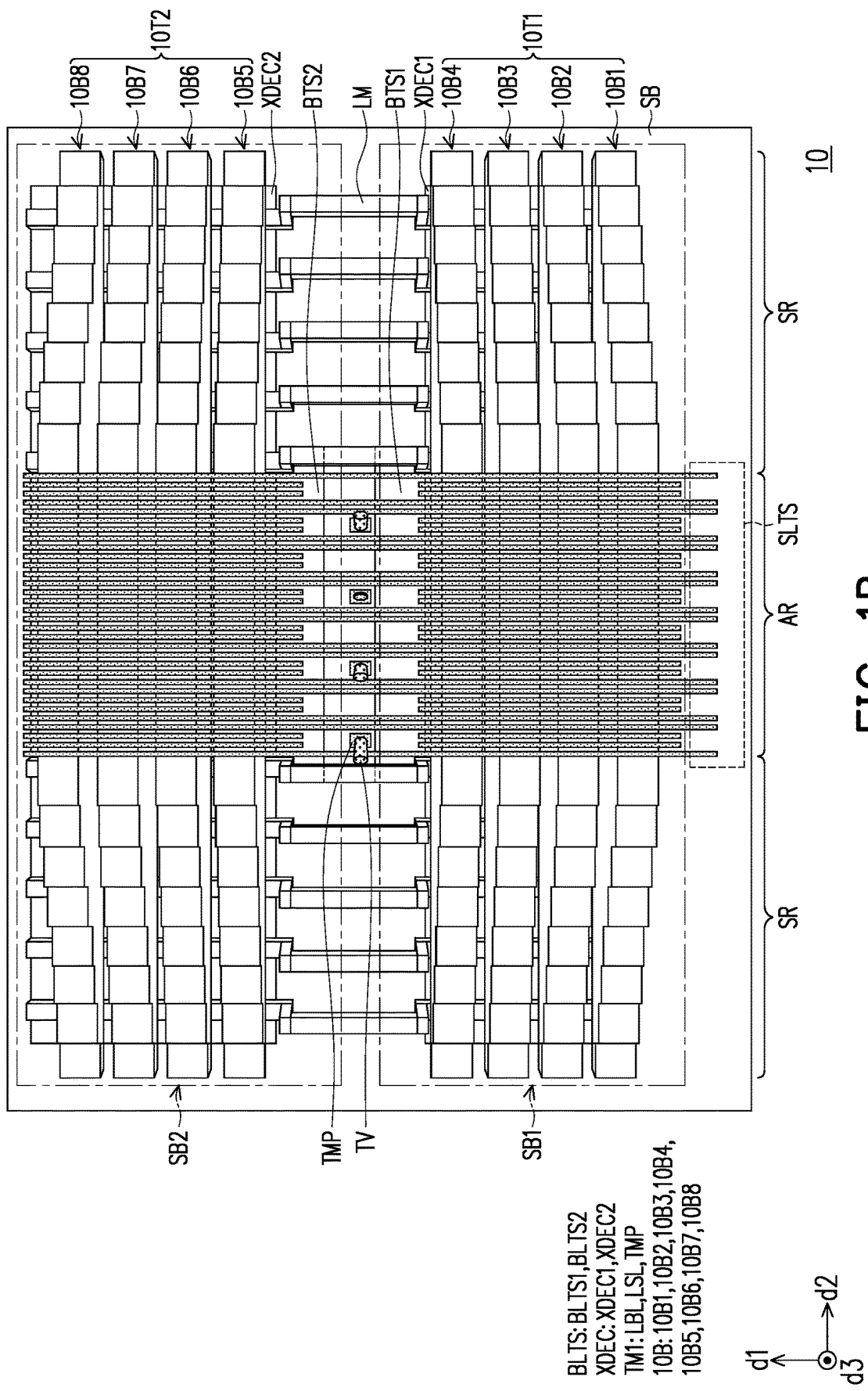
FIG. 1B is a schematic top view of a 3D memory according to an embodiment of the present disclosure.
Figure 1C:
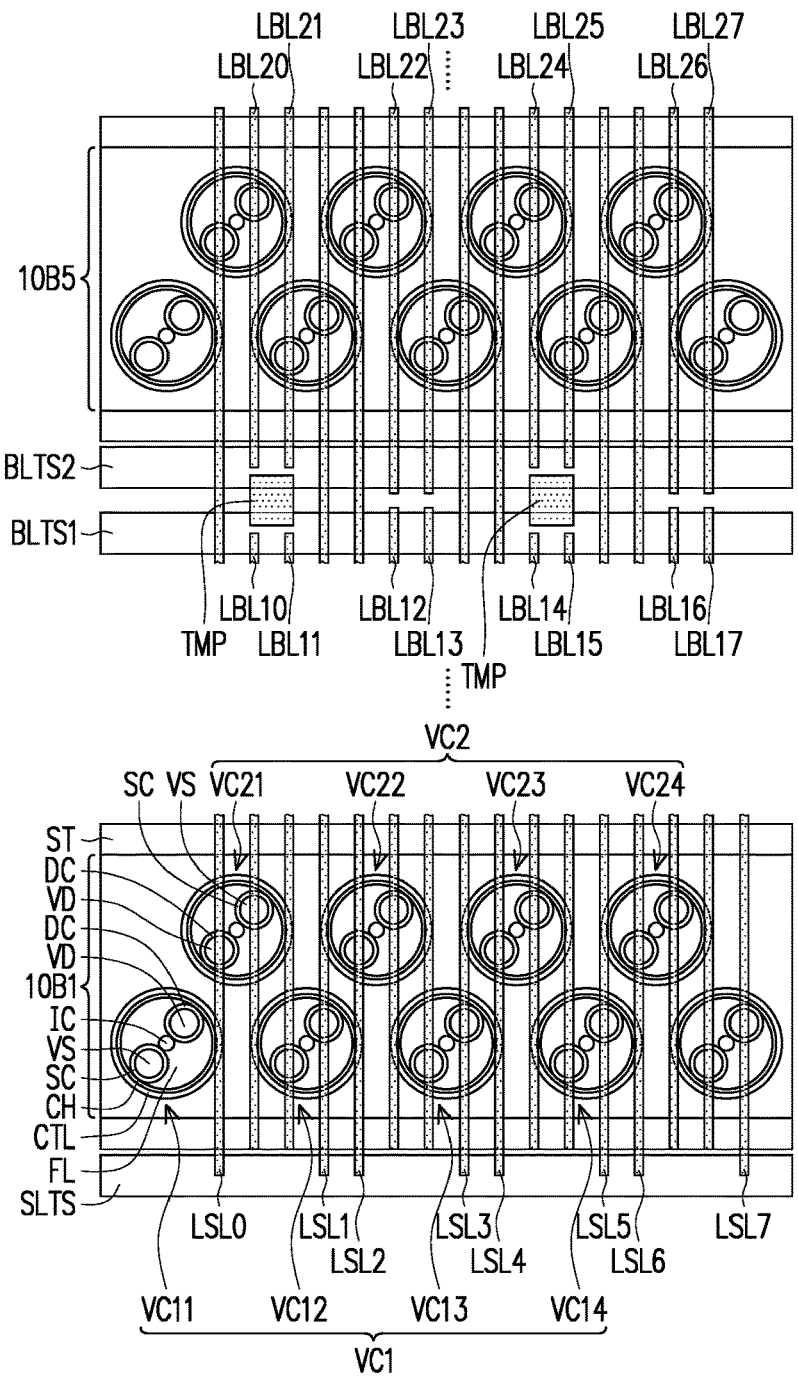
FIG. 1C is a partial schematic diagram of an embodiment of the 3D memory of FIG. 1B.
Figure 1D:
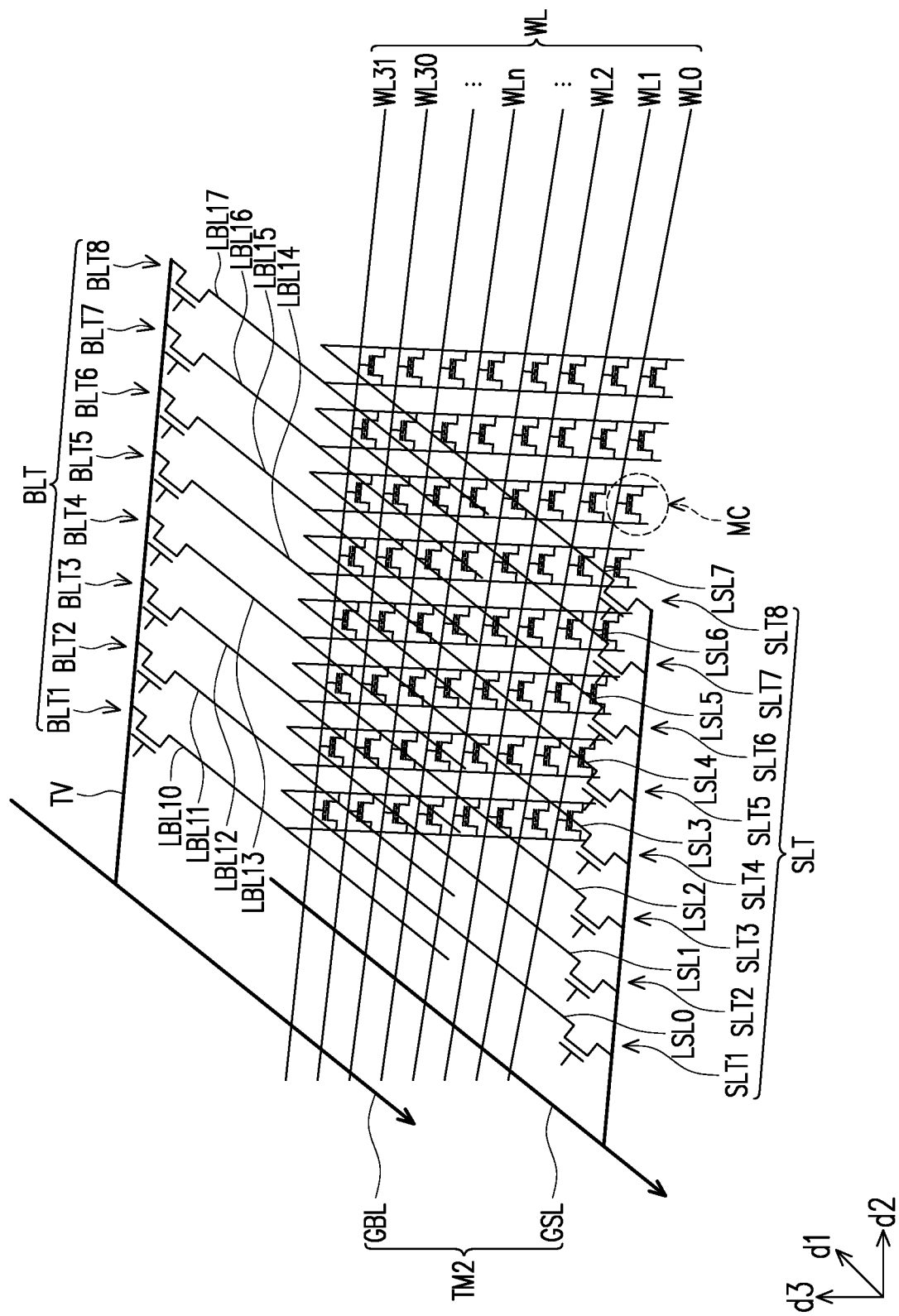
FIG. 1D shows a circuit diagram of a 3D according to an embodiment of the present disclosure.

FIG. 1A is a partial perspective view of a 3D memory according to an embodiment of the present disclosure, FIG. 1B is a schematic top view of a 3D memory according to an embodiment of the present disclosure, FIG. 1C is a partial schematic diagram of an embodiment of the 3D memory of FIG. 1B, and FIG. 1D shows a circuit diagram of a 3D according to an embodiment of the present disclosure.

Referring to FIGS. 1A to 1C, the 3D memory 10 provided by the present disclosure can be a high-capacity and high-performance 3D AND flash memory or a 3D NOR flash memory. In the present embodiment, the 3D memory 10 is a 3D NOR flash memory, but the disclosure is not limited thereto. The 3D memory 10 of the present embodiment includes a plurality of tiles 10T. For example, each tiles 10T could store 16M bits of data. In the present embodiment, the tile 10T in the 3D memory 10 is divided into two sub-tiles 10T1 and 10T2. The sub-tiles 10T1 and 10T2 could each store 8M bits of data, which will be described in detail in subsequent embodiments. It is worth mentioned that FIGS. 1A to 1C only show that the 3D memory 10 includes one tile 10T as an example, but the present disclosure is not limited thereto.

The plurality of tiles 10T included in the 3D memory 10 are disposed on the substrate SB. The substrate SB could be a semiconductor substrate. In some embodiments, a material of the substrate SB could include silicon, doped silicon, germanium, silicon germanium, semiconductor compounds, other suitable semiconductor materials, or combinations thereof. For example, the substrate SB could be a silicon substrate, but the disclosure is not limited thereto. In some embodiments, multiple doped regions could be formed in the substrate SB according to design requirements. For example, multiple doping regions including a P-type well region (not shown) and an N-type deep well region (not shown) could be formed in the substrate SB, but the disclosure is not limited thereto. In other embodiments, a buried oxide layer (not shown) could be formed on the substrate SB. In the present embodiment, the substrate SB could include a first region SB1 and a second region SB2, in which the sub-tile 10T1 is disposed in the first region SB1 and the sub-block unit 10T2 is disposed in the second region SB2. However, the disclosure is not limited thereto.

In some embodiments, the tile 10T could include a plurality of memory blocks 10B. As shown in FIG. 1B, the sub-tile 10T1 and the sub-tile 10T2 each include the memory blocks 10B1, 10B2, 10B3, 10B4 and the memory blocks 10B5, 10B6, 10B7, and 10B8, but the disclosure is not limited thereto. Namely, the 3D memory 10 of the present embodiment could also include a plurality of memory blocks not shown in FIG. 1B.

In some embodiments, one of the plurality of memory blocks 10B could include a stack structure SS and a plurality of vertical channel structures VC, wherein the plurality of memory blocks 10B could be defined by a plurality of separation structures ST, but the disclosure is not limited thereto.

The plurality of separation structures ST could be disposed on the substrate SB. In some embodiments, the plurality of separation structures ST could extend in a second direction d2 and could be used to define the plurality of memory blocks 10B of the 3D memory 10. For example, as shown in FIG. 1C, in the present embodiment, two adjacent separation structures ST could be used to define the memory block 10B1 and the memory block 10B5, but the disclosure is not limited thereto.

The stacked structure SS could include a plurality of word lines WL and a plurality of insulating layers IL alternately stacked in a normal direction d3 of the substrate SB. For example, as shown in FIGS. 1A and 1D, the stacked structure SS in the 3D memory 10 of the present embodiment could include thirty-two word lines WL0, WL1, WL2, .... WLn..., WL30, WL31 and thirty-two insulating layers, but the present disclosure is not limited thereto. The plurality of word lines WL could each extend on a plane defined by a first direction d1 and the second direction d2, wherein the first direction d1 could be orthogonal to the second direction d2, and the first direction d1 and the second direction d2 could be orthogonal to the normal direction d3 of the substrate SB. In the present embodiment, the word lines WL0-WL31 could sequentially have smaller length along the second direction d2 in the normal direction d3 of the substrate SB, so that the plurality of word lines WL could be formed with a stepped structure composed of an array region AR and a step region SR. In some embodiments, a material of the plurality of word lines WL could include suitable conductive materials. For example, the material of the plurality of word lines WL could include tungsten, but the present disclosure is not limited thereto.

The corresponding word lines among the plurality of word lines WL could each be regarded as a layer of memory cell pages. In the present embodiment, a sector in the memory block 10B could include one memory cell page. Referring to FIG. 1B and FIG. 1D, each of the plurality of memory blocks 10B includes 32 sectors. Therefore, the sub-tile 10T1 (including the memory blocks 10B1, 10B2, 10B3, 10B4) and the sub-tile 10T2 (including the memory blocks 10B5, 10B6, 10B7, 10B8) could each include 128 sectors; however, the present disclosure is not limited thereto.

The plurality of vertical channel structures VC could be disposed on the substrate SB, wherein each of the plurality of vertical channel structures VC could extend in the normal direction d3 of the substrate SB. In some embodiments, the plurality of vertical channel structures VC are disposed in the array region AR of the substrate SB and penetrate the stacked structure SS in the normal direction d3 of the substrate SB. One of the plurality of vertical channel structures VC could include a cell string, in which each memory cell in the memory cell string is electrically connected to a corresponding word line, but the present disclosure is not limited thereto. In the present embodiment, each of the plurality of vertical channel structures VC could include a channel layer CH, an insulating pillar IC, a source pillar SC, a drain pillar DC, a filling layer FL and a charge trapping layer CTL, but the present disclosure is not limited thereto.

The channel layer CH could have an annular structure in the normal direction d3 of the substrate SB. In some embodiments, the channel layer CH could include suitable semiconductor materials. For example, a material of the channel layer CH could include polysilicon, but the present disclosure is not limited thereto.

The insulating pillar IC could be surrounded by the channel layer CH. Namely, the insulating pillar IC could be disposed inside the channel layer CH, and could extend in the normal direction d3 of the substrate SB. In some embodiments, a material of the insulating pillar IC could include a suitable dielectric material. For example, the material of the insulating pillar IC could include silicon oxide, but the present disclosure is not limited thereto.

The source pillar SC and the drain pillar DC could be surrounded by the channel layer CH. Namely, the source pillar SC and the drain pillar DC could also be disposed inside the channel layer CH, and could extend in the normal direction d3 of the substrate SB. In some embodiments, the source pillar SC and the drain pillar DC could each include a suitable semiconductor material. For example, the material of the source pillar SC and the drain pillar DC could include polycrystalline silicon or other metal materials, but the present disclosure is not limited thereto.

The filling layer FL could be surrounded by the channel layer CH, and could be used to fill an interior of the channel layer CH. In detail, the filling layer FL could be used as a support to fill the region in the interior of the channel layer CH not occupied by the above components, but the present disclosure is not limited thereto. In some embodiments, a material of the filling layer FL may include a suitable dielectric material. For example, the material of the filling layer FL could include silicon oxide, but the present disclosure is not limited thereto.

The charge trapping layer CTL could be disposed around the channel layer CH, which could be an external structure of the vertical channel structure VC. In some embodiments, the charge trapping layer CTL could include a composite structure. In the present embodiment, the charge trapping layer CTL could include three dielectric layers sequentially stacked on a side surface of the channel layer CH. For example, the charge trapping layer CTL could include an oxide-nitride-oxide (ONO) composite layer, but the disclosure is not limited thereto. In other embodiments, the charge trapping layer CTL could include a composite layer of oxide-nitride-oxide-nitride-oxide (ONONO) or a composite layer including other structures.

Based on the above, the memory cell can be defined by a vertical channel structure VC surrounded by a layer of word lines WL. For example, a memory cell MC shown in FIG. 1D is defined by one vertical channel structure VC surrounded by the word line WL0, but the present disclosure is not limited thereto. In some embodiments, the memory cells could perform 1-bit operations or 2-bit operations through different operation methods. For example, when a voltage is applied to the source pillar SC and the drain pillar DC, since the source pillar SC and the drain pillar DC are electrically connected to the channel layer CH, electrons could be transported along the channel layer CH and stored in the charge trapping layer CTL, this could perform 1-bit operations on memory cells. In addition, for operations utilizing Fowler-Nordheim tunneling, electrons or holes could be trapped in the charge trapping layer CTL between the source column SC and the drain column DC. For source side injection, channel-hot-electron injection or band-to-band tunneling hot carrier injection operations, the electrons or the holes could be locally trapped in the charge trapping layer CTL adjacent to one of the two source pillar SC and drain pillar DC, so that a single-level cell (SLC; 1 bit) operation or a multi-level cell (MLC; greater than or equal to 2 bits) operation could be performed, but the disclosure is not limited thereto.

In the present embodiment, one of the plurality of memory blocks 10B could include at least two rows of vertical channel structures VC. For example, one of the memory block 10B1 and the memory block 10B2 includes two rows of vertical channel structures VC, wherein the vertical channel structures VC are staggered in the second direction d2. In detail, taking the memory block 10B1 shown in FIG. 1C as an example, the memory block 10B1 includes a first row of vertical channel structures VC1 and a second row of vertical channel structures VC2, wherein the first row of vertical channel structures VC1 includes vertical channel structures VC11, VC12, VC13, and VC14 arranged along the second direction d2, and the second row of vertical channel structures VC2 includes vertical channel structures VC21, VC22, VC23, and VC24 arranged along the second direction d2, and the vertical channel structure VC11, the vertical channel structures VC21, the vertical channel structure VC12, the vertical channel structure VC22, the vertical channel structure VC13, the vertical channel structure VC23, the vertical channel structure VC14 and the vertical channel structure VC24 are staggered in this order in the second direction d2.

In the present embodiment, the 3D memory 10 further includes a bit line transistor structure BLTS, a source line transistor structure SLTS, a plurality of local bit lines LBL, a plurality of local source lines LSL, conductive patterns TMP, a word line decoder XDEC, a control logic CL, a global bit line GBL and a global source line GSL.

The bit line transistor structure BLTS could be disposed on the substrate SB. In some embodiments, the bit line transistor structure BLTS could include a plurality of bit line transistors BLT (such as bit line transistors BLT1 and BLT2 shown in FIG. 1A, and bit line transistors BLT1, BLT2, BLT3, BLT4, BLT5, BLT6, BLT7, and BLT8 shown in FIG. 1D). In the present embodiment, the bit line transistor structure BLTS includes a first bit line transistor structure BLTS1 and a second bit line transistor structure BLTS2, wherein the first bit line transistor structure BLTS1 is disposed in the first region SB1 and is disposed between the sub-tile 10T1 and the sub-tile 10T2. The second bit line transistor structure BLTS2 is disposed in the second region SB2 and is also disposed between the sub-tile 10T1 and the sub-tile 10T2. Referring to FIG. 1D, in the present embodiment, the first bit line transistor structure BLTS1 could include eight bit line transistors BLT1-BLT8. In addition, although not shown in FIG. 1D, the second bit line transistor structure BLTS2 could also include eight bit line transistors; that is, the bit line transistor structure BLTS may include sixteen bit line transistors, but the disclosure is not limited thereto.

In the present embodiment, as shown in FIG. 1B and FIG. 1D, the first bit line transistor structure BLTS1 could drive 128 sectors in the sub-tile 10T1, and the second bit line transistor structure BLTS2 could drive 128 sectors in sub-tile 10T2, but the disclosure is not limited thereto.

In the present embodiment, taking the second bit line transistor structure BLTS2 as an example, as shown in FIG. 1A, the second bit line transistor structure BLTS2 could be electrically connected to the local bit line LBL through a contact window VB1 which would be introduced later, and could be electrically connected to the global bit line GBL through a contact window VB2 which would be introduced later. The technical features would be described in detail in the following embodiments.

The source line transistor structure SLTS could be disposed on the substrate SB. In some embodiments, the source line transistor structure SLTS could include a plurality of source line transistors SLT (for example, source line transistors SLT1, SLT2, SLT3, SLT4, SLT5, SLT6, SLT7, and SLT8 shown in FIG. 1D). In the present embodiment, the source line transistor structure SLTS is disposed on a side of the sub-tile 10T1 away from the sub-tile 10T2, but the disclosure is not limited thereto.

In the present embodiment, the source line transistor structure SLTS could be electrically connected to the local source line LSL which would be introduced later through a contact window VS, and could be electrically connected to the global source line GSL (shown in FIG. 1D) through another contact window (not shown). The technical features would be described in detail in the following embodiments.

The plurality of local bit lines LBL could be disposed on the substrate SB, and could extend in the first direction d1. In some embodiments, the plurality of local bit lines LBL are respectively disposed on corresponding vertical channel structures VC. In the present embodiment, it is worth mentioned that the corresponding local bit line LBL could be electrically connected to the drain pillar DC in the corresponding vertical channel structure VC through a plug PD. In some embodiments, a material of the plurality of local bit lines LBL could be the same or similar to the materials of the plurality of word lines WL.

In the present embodiment, the plurality of local bit lines LBL include a first group of local bit lines LBL1 and a second group of local bit lines LBL2, wherein the first group of local bit lines LBL1 is disposed in the first region SB1 and is electrically connected to the first bit line transistor structure BLTS1. The second group of local bit lines LBL2 is disposed in the second region SB2 and is electrically connected to the second bit line transistor structure BLTS2.

In the present embodiment, the first group of local bit lines LBL1 and the second group of local bit lines LBL2 are separated from each other in the first direction d1, but the disclosure is not limited thereto. In other embodiments, the local bit lines in the first group of local bit lines LBL1 could be connected to the corresponding local bit lines in the second group of local bit lines LBL2 in the first direction d1, but the disclosure is not limited thereto.

In the present embodiment, the local bit lines in the first group of local bit lines LBL1 correspond the local bit lines in the second group of local bit lines LBL2 in the first direction d1. In detail, referring to FIG. 1C, in some embodiments, the first group of local bit lines LBL1 could include a local bit line LBL10, a local bit line LBL11, a local bit line LBL12, a local bit line LBL13, a local bit line LBL14, a local bit line LBL15, a local bit line LBL16 and a local bit line LBL17, and the second group of local bit lines LBL2 could include a local bit line LBL20, a local bit line LBL21, a local bit line LBL22, a local bit line LBL23, a local bit line LBL24, a local bit line LBL25, a local bit line LBL26 and a local bit line LBL27, wherein the local bit line LBL10 and the local bit line LBL20 are separated from each other in the first direction d1, and the local bit line LBL11 and the local bit line LBL21 are separated from each other in the first direction d1. The following is analogous and would be omitted.

The plurality of local source lines LSL could be disposed on the substrate SB, and could each extend in the first direction d1. In some embodiments, the plurality of local source lines LSL are respectively disposed on corresponding vertical channel structures VC. In the present embodiment, it is worth mentioned that the corresponding local source line LSL could be electrically connected to the source pillar SC in the corresponding vertical channel structure VC through a plug PS. In some embodiments, a material of the plurality of local source lines LSL could be the same or similar to the materials of the plurality of word lines WL.

The conductive patterns TMP could be disposed on the substrate SB. From another perspective, the conductive patterns TMP, the plurality of local bit lines LBL and the plurality of local source lines LSL all belong to a portion of a first upper conductive layer TM1, wherein the conductive patterns TMP, the plurality of local bit lines LBL and the plurality of local source lines LSL are separated with each other. The conductive patterns TMP could be electrically connected to the global bit line GBL through a contact window TV, so that the plurality of local bit lines LBL could be electrically connected to the global bit line GBL through the bit line transistor structure BLTS. Namely, the plurality of local bit lines LBL and the global bit line GBL could be electrically connected to each other through the contact window VB1, the bit line transistor structure BLTS, the contact window VB2, the conductive patterns TMP and the contact window TV.

In the present embodiment, in order to allow the conductive patterns TMP to have sufficient arrangement, in addition to making the first group of local bit lines LBL1 and the second group of local bit lines LBL2 separated from each other in the first direction d1, the following design exists between the plurality of local bit lines LBL and the plurality of local source lines LSL: two adjacent local bit lines LBL are disposed between adjacent two local source lines LSL.

In detail, referring to FIG. 1C, in some embodiments, the plurality of local source lines LSL could each include a local source line LSL0, a local source line LSL1, a local source line LSL2, a local source line LSL3, a local source line LSL4, a local source line LSL5, a local source line LSL6 and a local source line LSL7. Taking the first group of local bit lines LBL1 located in the first region SB1 as an example, two adjacent local bit lines LBL10 and LBL11 are disposed between adjacent two local source lines LSL0 and LSL1, two adjacent local bit lines LBL12 and LBL13 are disposed between adjacent two local source lines LSL2 and LSL3, two adjacent local bit lines LBL14 and LBL15 are disposed between adjacent two local source lines LSL4 and LSL5, and two adjacent local bit lines LBL16 and LBL17 are disposed between adjacent two local source lines LSL6 and LSL7. It is worth mentioning that the relationship between the second group of local bit lines LBL2 and the local source lines LSL located in the second region SB2 is similar to the above embodiment and would be omitted. It is worth mentioned that the arrangement relationship between the source pillar SC and the drain pillar DC in the first row of vertical channel structures VC1 and the second row of vertical channel structures VC2 would be opposite since two adjacent local bit lines LBL are disposed between adjacent two local source lines LSL, as shown in FIG. 1C.

Through the above configuration, the conductive patterns TMP could be disposed between the first group of local bit lines LBL1 and the second group of local bit lines LBL2 separated from each other in the first direction d1, and could be disposed between the adjacent two local source lines LSL in the second direction d2. Based on the above, the conductive patterns TMP could be used to electrically connect the first group of local bit lines LBL1 and the second group of local bit lines LBL2 to the global bit line GBL.

In detail, referring to FIG. 1A and FIG. 1B, in some embodiments, taking the second group of local bit lines LBL2 as an example, the conductive patterns TMP could be electrically connected to the global bit line GBL through the contact window TV, and could be electrically connected to the second group of local bit lines LBL2 through the contact window VB2. Based on the above, the second group of local bit lines LBL2 could be electrically connected to the global bit line GBL through the arrangement of the conductive patterns TMP. Namely, the second group of local bit lines LBL2 and the global bit line GBL could be electrically connected to each other through a current path of the contact window VB1, the bit line transistor structure BLTS, the contact window VB2, the conductive patterns TMP and the contact window TV. It is worth mentioned that the relationship of electrical connection between the first group of local bit lines LBL1 located in the first region SB1 and the global bit line GBL is similar to the above embodiment and would be omitted.

The word line decoder XDEC could be disposed on the substrate SB. In the present embodiment, the word line decoder XDEC includes a plurality of transistors (not shown) and is disposed between the stacked structure SS and the substrate SB in the normal direction d3 of the substrate SB. The plurality of transistors included in the word line decoder XDEC could be complementary metal oxide semiconductor field effect transistors (CMOS). Therefore, this architecture could be called a complementary metal oxide semiconductor field effect transistor under the array (CMOS under Array; CUA) architecture. In some embodiments, the plurality of transistors in the word line decoder XDEC could be electrically connected to the plurality of word lines WL to control corresponding word lines. Specifically, the word line decoder XDEC could be electrically connected to the corresponding memory cell through the word line WL. In some embodiments, the word line decoder XDEC is configured to operate under the control of the control logic CL to be described later. For example, the word line decoder XDEC could receive a word line address data from the outside via the control logic CL. The word line decoder XDEC could be used to decode the word line address, and could apply a voltage provided from a voltage generator (not shown) to the corresponding word line according to the decoded word line address.

In the present embodiment, the word line decoder XDEC includes a word line decoder XDEC1 and a word line decoder XDEC2, wherein the word line decoder XDEC1 and the word line decoder XDEC2 could each be electrically connected to the plurality of word lines WL in the sub-tiles 10T1 and 10T2.

The control logic CL could be disposed on the substrate SB, and could be electrically connected to the word line decoder XDEC. In some embodiments, the control logic CL could receive commands and address data from a controller (not shown), and respond to corresponding commands to control the word line decoder XDEC and other components not shown. In addition, the control logic CL sends the above word line address data to the word line decoder XDEC.

The global bit line GBL could be disposed on the substrate SB. In the present embodiment, the global bit line GBL is electrically connected to the plurality of local bit lines LBL. The relationship of electrical connection between the global bit line GBL and the plurality of local bit lines LBL could refer to the aforementioned embodiment and would be omitted. In some embodiments, a material of the global bit line GBL could be the same as or similar to the material of the plurality of word lines WL. Referring to FIG. 1D, in the present embodiment, the global bit line GBL could be electrically connected to the bit line transistor structure BLTS including sixteen bit line transistors.

In some embodiments, as shown in FIG. 1D, the 3D memory 10 could further include the global source line GSL. The global source line GSL could be disposed on the substrate SB. In the present embodiment, the global source line GSL is electrically connected to the plurality of local source lines LSL. The relationship of electrical connection between the global source line GSL and the plurality of local source lines LSL could refer to the aforementioned embodiment and would be omitted. In some embodiments, a material of the global bit line GBL could be the same as or similar to the material of the plurality of word lines WL.

From another perspective, the global bit line GBL and the global source line GSL belong to a portion of a second upper conductive layer TM2, but the disclosure is not limited thereto.

In some embodiments, the 3D memory 10 could also include a peripheral circuit PC. The peripheral circuit PC could include a sense amplifier SA and a page buffer PB, wherein the sense amplifier SA and the page buffer PB are disposed on the substrate SB, but the disclosure is not limited thereto. The sense amplifier SA could be electrically connected to the global bit line GBL, and could be electrically connected to the tile 10T through the global bit line GBL. In some embodiments, the sense amplifier SA could include a current-to-voltage converter (not shown) and an amplification circuit (not shown). The current-to-voltage converter could be used to convert a current signal read from the memory cell of the tile 10T into a voltage signal, and the amplifying circuit could be used to generate a read data based on the voltage signal provided by the current-voltage converter. The page buffer PB could be electrically connected to the sense amplifier SA, and could be electrically connected to the local bit line LBL and the tile 10T through the global bit line GBL. In some embodiments, the page buffer PB could include a plurality of page buffer units (not shown) respectively connected to corresponding local bit lines LBL, and is operated under the control of the control logic CL. For example, during a read operation, the page buffer PB reads the data in the memory cell connecting to the selected word line through the corresponding local bit line LBL, and the data processed by the sense amplifier SA could be output to an external host device through a data input/output unit (not shown) coupled to the page buffer PB.

In some embodiments, the 3D memory 10 may further include a lower conductive layer LM. Referring to FIG. 1B, the lower conductive layer LM could be disposed between the stacked structure SS and the word line decoder XDEC in the normal direction d3 of the substrate SB, and could include a plurality of conductive lines extending along the first direction d1. Therefore, in the present embodiment, the stacked structure SS located in the first region SB1 and the stacked structure SS located in the second region SB2 could be electrically connected to the corresponding word line decoder XDEC through the arrangement of the lower conductive layer LM.

In summary, in the present embodiment, the tile 10T included in the 3D memory 10 is divided into the sub-tile 10T1 disposed in the first region SB1 and the sub-tile 10T1 disposed in the second region SB2 in the first direction d1. The plurality of local bit lines LBL are also divided into the first group of local bit lines LBL1 and the second group of local bit lines LBL2 in the first direction d1, wherein the first group of local bit lines line LBL1 is electrically connected to the first bit line transistor structure BLTS1 and the vertical channel structures VC in the memory blocks 10B1, 10B2, 10B3, and 10B4 in the sub-tile 10T1, and the second group of local bit lines LBL2 is electrically connected to the second bit line transistor structure BLTS2 and the vertical channel structures VC in the memory blocks 10B5, 10B6, 10B7, and 10B8 in the sub-tile 10T2.

Based on the above, a number of the sectors driven by each bit line transistor structure (such as the first bit line transistor structure BLTS1 and the second bit line transistor structure BLTS2) is reduced and the plurality of local bit lines LBL could have a relatively short length, which could reduce the bit line capacitance and the background leakage current, thereby improving the operation speed (such as the read speed) of the 3D memory 10. In the present embodiment, the bit line capacitance and/or the background leakage current on the plurality of local bit lines LBL in the 3D memory 10 compared to the local bit lines in the conventional 3D memory (the tiles are not divided) could be reduced by half, but the disclosure is not limited thereto.

Furthermore, through the arrangement of the conductive patterns TMP, the first group of local bit lines LBL1 and the second group of local bit lines LBL2 could each be electrically connected to the global bit line GBL to realize the design of the 3D memory 10 of the present embodiment.

Figure 2:
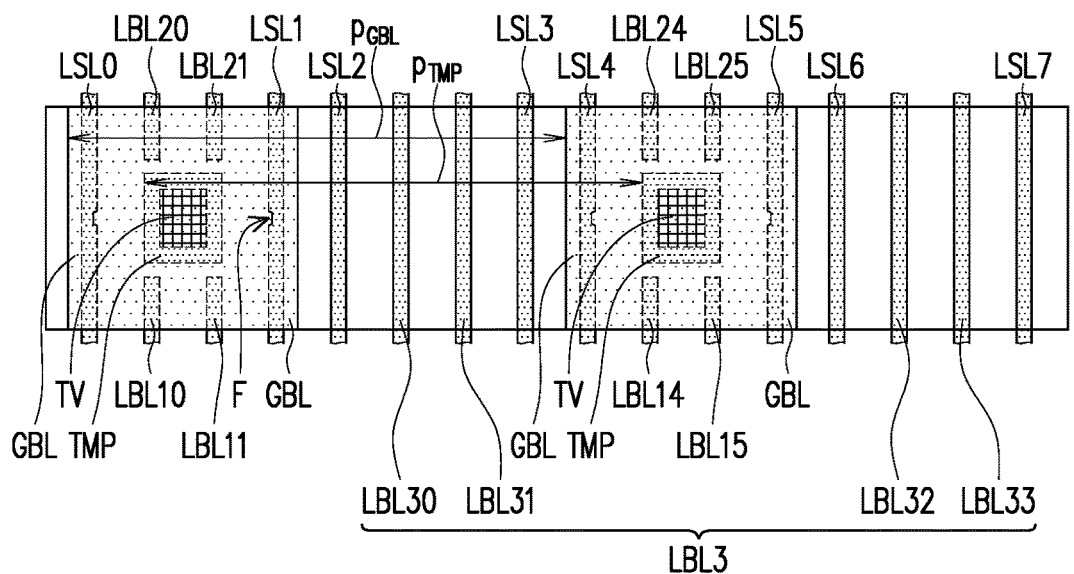
FIG. 2 is a partial schematic diagram of another embodiment of the 3D memory of FIG. 1B.
Figure 2:
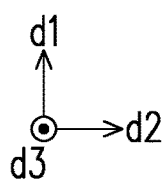

FIG. 2 is a partial schematic diagram of another embodiment of the 3D memory of FIG. 1B. It should be noted that the embodiment of FIG. 2 could respectively use the reference numbers and portions of the content of the embodiment of FIGS. 1A to 1D, wherein the same or similar reference numbers are used to represent the same or similar elements, and descriptions of the same technical contents are omitted.

Referring to FIG. 2, in the present embodiment, the first upper conductive layer TM1' further includes a third group of local bit lines LBL3, wherein the third group of local bit lines LBL3 extends along the first direction d1 and crosses the first region SB1 and the second region SB2. In detail, the third group of local bit lines LBL3 is not cut off, so that the third group of local bit lines LBL3 has a length longer than that of the first group of local bit lines LBL1 and the second group of local bit lines LBL2. In some embodiments, the third group of local bit lines LBL3 could be electrically connected to the first bit line transistor structure BLTS1 or the second bit line transistor structure BLTS2.

In the present embodiment, two adjacent local bit lines in the third group of local bit lines LBL3 are also disposed between adjacent two local source lines. In detail, referring to FIG. 2, in some embodiments, the third group of local bit lines LBL3 could each include a local bit line LBL30, a local bit line LBL31, a local bit line LBL32 and a local bit line LBL33. Two adjacent local bit lines LBL30 and LBL31 are disposed between adjacent two local source lines LSL1 and LSL2, and two adjacent local bit lines LBL32 and LBL33 are disposed between adjacent two local source lines LSL6 and LSL7.

In some embodiments, a pitch pGBL between the adjacent global bit lines GBL in the second direction d2 and a pitch $p_{TMP}$ between the adjacent conductive patterns TMP in the second direction could be the same, so that the global bit line GBL could be electrically connected to the conductive pattern TMP through the contact window TV. For example, the pitch pGBL between the adjacent global bit lines GBL in the second direction d2 could be 0.64 μm, and the pitch $p_{TMP}$ between the adjacent conductive patterns TMP in the second direction d2 could be 0.64 μm, but the disclosure is not limited thereto.

Please continue to refer to FIG. 2. In this embodiment, the local source line LSL adjacent to the conductive pattern TMP includes an opening F, wherein the opening F faces to the conductive pattern TMP. In detail, the local source lines LSL0, LSL1, LSL4, and LSL5 adjacent to the conductive pattern TMP each include the opening_F, wherein the opening F faces to and corresponds to the conductive pattern TMP in the second direction d2. A center line of the opening F could pass through a center of the conductive pattern TMP. In the present embodiment, the center line passing through the opening F is parallel to the second direction d2, but the disclosure is not limited thereto. By making the design of the opening F in the local source line LSL, the conductive pattern TMP formed through the exposure process could have a completed shape.

Figure 3:
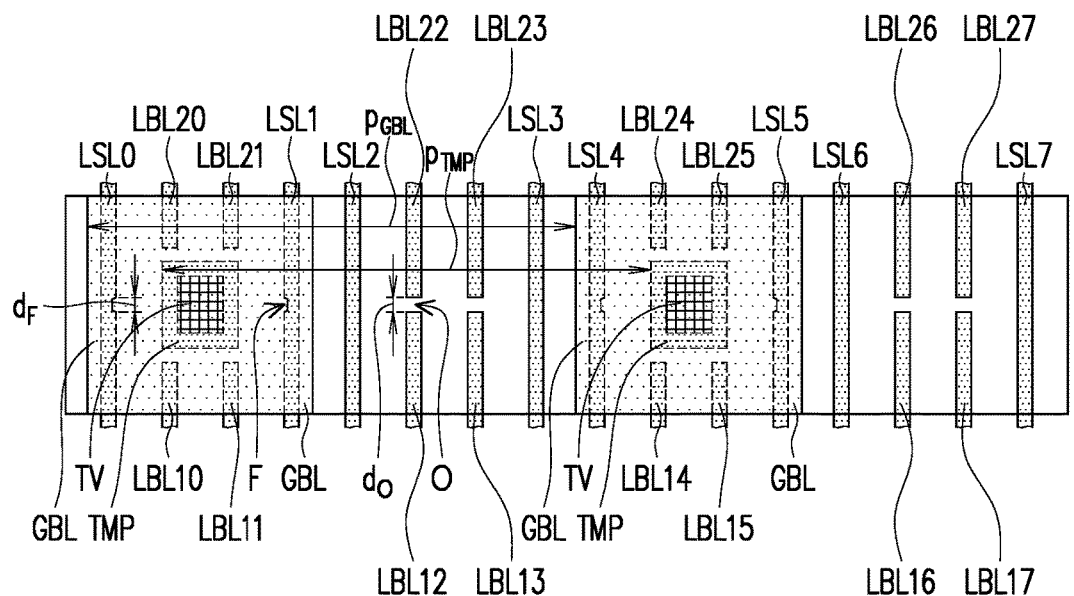
FIG. 3 is a partial schematic diagram of yet another embodiment of the 3D memory of FIG. 1B.

FIG. 3 is a partial schematic diagram of yet another embodiment of the 3D memory of FIG. 1B. It should be noted that the embodiment of FIG. 3 could respectively use the reference numbers and portions of the content of the embodiment of FIG. 2, wherein the same or similar reference numbers are used to represent the same or similar elements, and descriptions of the same technical contents are omitted.

Please refer to FIG. 3, in the present embodiment, the local source line LSL adjacent to the conductive pattern TMP includes an opening F, wherein the opening F faces to the conductive pattern TMP. The characteristics of the opening F could refer to the above embodiment, and descriptions of the same technical contents are omitted.

In the present embodiment, there is a gap O between one of the first group of local bit lines LBL1 not adjacent to the conductive pattern TMP and the corresponding one of the second group of local bit lines LBL2 in the first direction d1, and the opening F included in the local source line LSL could correspond to the gap O. Specifically, please refer to FIG. 1B and FIG. 3, the first group of local bit lines LBL1 not adjacent to the conductive pattern TMP includes local bit lines LBL12, LBL13, LBL16, and LBL17, and the second group of local bit lines LBL2 not adjacent to the conductive pattern TMP includes local bit lines LBL22, LBL23, LBL26, and LBL27, wherein there are gaps O between the local bit line LBL12 and the local bit line LBL22, between the local bit line LBL13 and the local bit line LBL23, between the local bit line LBL16 and the local bit line LBL26, and between the local bit line LBL17 and the local bit line LBL27, respectively. The opening F included in the local source line LSL could correspond to the above gaps O in the second direction d2.

In some embodiments, a width dr of the opening F in the first direction d1 and a size do of the gap O in the first direction d1 could be substantially the same, but the disclosure is not limited thereto.

In summary, the present disclosure could realize the design of the 3D memory of this embodiment by forming the conductive patterns in the first upper conductive layer. In detail, the 3D memory according to an embodiment of the present disclosure includes the tiles divided into the first sub-tile disposed in the first region and the second sub-tile disposed in the second region, and the plurality of the local bit lines are divided into the first group of local bit lines and the second group of local bit lines, wherein the first group of local bit lines is electrically connected to the first bit line transistor structure and the corresponding vertical channel structures in the first sub-tile, and the second group of local bit lines is electrically connected to the second bit line transistor structure and the corresponding vertical channel structures in the second sub-tile. Based on the above, the number of sectors driven by each bit line transistor structure could be reduced and the local bit lines could have a relative short length, which could reduce the bit line capacitance and the background leakage current, thereby improving the operating speed of the 3D memory according to an embodiment of the present disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A 3D memory, including:
    a plurality of tiles, disposed on a substrate, wherein one of the plurality of tiles includes a first sub-tile located in a first region of the substrate and a second sub-tile located in a second region of the substrate;
    a bit line transistor structure, disposed on the substrate and is located between the first sub-tile and the second sub-tile, including a first bit line transistor structure located in the first region and a second bit line transistor structure located in the second region;
    a first upper conductive layer, disposed on the substrate, including:
        a plurality of local bit line, extending along a first direction and including a first group of local bit lines and a second group of local bit lines, wherein the first group of local bit lines and the second group of local bit lines are separated from each other in the first direction;
        a plurality of local source lines, extending along the first direction, wherein two adjacent local bit lines among the plurality of local bit lines are disposed between adjacent two local source lines; and
        a conductive pattern, disposed between the first group of local bit lines and the second group of local bit lines in the first direction, and is disposed between the adjacent two local source lines in a second direction; and
    a second upper conductive layer, disposed on the first upper conductive layer, including:
        a global bit line, electrically connected to the first group of local bit lines and the second group of local bit lines through the conductive pattern.

2. The 3D memory according to claim 1, wherein a contact window is disposed between the first upper conductive layer and the second upper conductive layer, and the global bit line is electrically connected to the conductive pattern through the contact window.

3. The 3D memory according to claim 1, wherein the plurality of local bit lines further include a third group of local bit lines, and the third group of local bit lines cross the first region and the second region.

4. The 3D memory according to claim 1, wherein each of the first sub-tile and the second sub-tile includes a plurality of memory blocks, and one of the plurality of memory blocks includes a stacked structure and a plurality of vertical channel structures penetrating the stacked structure in a normal direction of the substrate.

5. The 3D memory according to claim 4, wherein the stacked structure includes a plurality of word lines and a plurality of insulating layers stacked alternately in the normal direction of the substrate.

6. The 3D memory according to claim 4, wherein one of the plurality of vertical channel structures includes:
   a channel layer, having an annular structure in the normal direction of the substrate;
   an insulating pillar, are disposed inside the channel layer;
   a source pillar and a drain pillar, are disposed inside the channel layer;
   a filling layer, filling an interior of the channel layer; and
   a charge trapping layer, surrounding the channel layer.

7. The 3D memory according to claim 6, the plurality of vertical channel structures include a first row of vertical channel structures and a second row of vertical channel structures, and the first row of vertical channel structures and the second row of vertical channel structures are staggered in the second direction.

8. The 3D memory according to claim 7, an arrangement relationship between the source pillar and the drain pillar in the first row of vertical channel structures and the second first row of vertical channel structures is opposite.

9. The 3D memory according to claim 6, the plurality of local bit lines are electrically connected to the corresponding drain pillar through first plugs, and the plurality of local source lines are electrically connected to the corresponding source pillar through second plugs.

10. The 3D memory according to claim 1, wherein the second upper conductive layer further includes a global source line, and the global source line is electrically connected to the plurality of local source lines.

11. The 3D memory according to claim 10, further including a source line transistor structure, wherein the source line transistor structure is disposed on the substrate and located on a side of the first sub-tile away from the second sub-tile, and the source line transistor structure is electrically connected to the global source line and the plurality of local source lines.

12. The 3D memory according to claim 4, further including:
   a word line decoder, disposed between the stacked structure and the substrate in the normal direction of the substrate, and electrically connected to the plurality of word lines; and
   a control logic, disposed on the substrate and electrically connected to the word line decoder.

13. The 3D memory according to claim 4, further including:
   a lower conductive layer, disposed between the stacked structure and the word line decoder in the normal direction of the substrate, and the stacked structure is electrically connected to the word line decoder via the lower conductive layer.

14. The 3D memory according to claim 4, further including:
   a sense amplifier, disposed on the substrate and electrically connected to the global bit line; and
   a page buffer, disposed on the substrate and electrically connected to the sense amplifier.

15. The 3D memory according to claim 1, wherein a pitch between the adjacent global bit lines in the second direction and a pitch between the adjacent conductive patterns TMP in the second direction are the same.

16. The 3D memory according to claim 1, wherein the local source line adjacent to the conductive pattern includes an opening, and the opening faces to the conductive pattern.

17. The 3D memory according to claim 16, wherein a center line of the opening passes through a center of the conductive pattern, and the center line is parallel to the second direction.

18. The 3D memory according to claim 16, wherein there is a gap between one of the first group of local bit lines not adjacent to the conductive pattern and the corresponding one of the second group of local bit lines in the first direction.

19. The 3D memory according to claim 18, wherein the opening corresponds to the gap in the second direction.

20. The 3D memory according to claim 18, wherein a width of the opening in the first direction and a size of the gap in the first direction are the same.

* * * * *